United States Patent
Golab et al.

(10) Patent No.: US 9,576,619 B2
(45) Date of Patent: *Feb. 21, 2017

(54) SHIFTABLE MEMORY SUPPORTING ATOMIC OPERATION

(75) Inventors: Wojciech Golab, Palo Alto, CA (US); Matthew D. Pickett, San Francisco, CA (US); Alan H. Karp, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 23 days.

This patent is subject to a terminal disclaimer.

(21) Appl. No.: 14/349,678

(22) PCT Filed: Oct. 27, 2011

(86) PCT No.: PCT/US2011/058181
§ 371 (c)(1),
(2), (4) Date: Apr. 4, 2014

(87) PCT Pub. No.: WO2013/062561
PCT Pub. Date: May 2, 2013

(65) Prior Publication Data
US 2014/0310453 A1 Oct. 16, 2014

(51) Int. Cl.
*G06F 9/315* (2006.01)
*G11C 7/10* (2006.01)
(Continued)

(52) U.S. Cl.
CPC .............. *G11C 7/1036* (2013.01); *G06F 5/00* (2013.01); *G06F 9/30134* (2013.01);
(Continued)

(58) Field of Classification Search
CPC ..... G06F 5/00; G06F 9/30134; G11C 19/188; G11C 19/287; G11C 7/1036
See application file for complete search history.

(56) References Cited

U.S. PATENT DOCUMENTS

| 3,593,310 A | * | 7/1971 | Kievit | ................... | G09G 5/343 |
| | | | | | 345/685 |
| 3,670,313 A | | 6/1972 | Beausoleil et al. | | |

(Continued)

FOREIGN PATENT DOCUMENTS

| CN | 1762027 A | 4/2006 |
| CN | 10116471 A | 4/2008 |

(Continued)

OTHER PUBLICATIONS

Chen-Yi Lee et al., "High-Speed Median Filter Designs Using Shiftable Content-Addressable Memory," IEEE Trans. Circuits and Systems for Video Tech., vol. 4, No. 6, Dec. 1994, pp. 544-549.

(Continued)

*Primary Examiner* — Henry Tsai
*Assistant Examiner* — John Roche
(74) *Attorney, Agent, or Firm* — North Shore Associates

(57) ABSTRACT

A shiftable memory supporting atomic operation employs built-in shifting capability to shift a contiguous subset of data from a first location to a second location within memory during an atomic operation. The shiftable memory includes the memory to store data. The memory has the built-in shifting capability. The shiftable memory further includes an atomic primitive defined on the memory to operate on the contiguous subset.

16 Claims, 6 Drawing Sheets

(51) Int. Cl.
   *G11C 19/18*  (2006.01)
   *G11C 19/28*  (2006.01)
   *G06F 5/00*   (2006.01)
   *G06F 9/30*   (2006.01)
   *G06F 9/54*   (2006.01)

(52) U.S. Cl.
   CPC .......... *G06F 9/544* (2013.01); *G11C 19/188* (2013.01); *G11C 19/287* (2013.01); *G06F 2209/521* (2013.01)

(56) References Cited

U.S. PATENT DOCUMENTS

| | | | |
|---|---|---|---|
| 3,708,690 A | | 1/1973 | Paivinen |
| 3,760,382 A | | 9/1973 | Itoh |
| 3,797,992 A | | 3/1974 | Brown |
| 3,812,336 A | | 5/1974 | Bossen et al. |
| 3,838,396 A | | 9/1974 | Martin |
| 3,893,088 A | | 7/1975 | Bell |
| 3,916,388 A | | 10/1975 | Shimp |
| 4,037,205 A | | 7/1977 | Edelberg et al. |
| 4,133,043 A | | 1/1979 | Hiroshima et al. |
| 4,322,635 A | | 3/1982 | Redwine |
| 4,504,925 A | | 3/1985 | Gilhousen |
| 4,521,874 A | * | 6/1985 | Rau .................. G06F 17/30982 365/221 |
| 4,532,606 A | | 7/1985 | Phelps |
| 4,845,670 A | | 7/1989 | Nishimoto et al. |
| 4,864,544 A | * | 9/1989 | Spak .......................... G06F 7/78 327/203 |
| 4,903,240 A | | 2/1990 | Von Flue |
| 5,050,067 A | | 9/1991 | McLagan |
| 5,153,846 A | | 10/1992 | Rao |
| 5,299,156 A | | 3/1994 | Jiang et al. |
| 5,313,433 A | | 5/1994 | Waller |
| 5,504,919 A | | 4/1996 | Lee et al. |
| 5,543,748 A | | 8/1996 | Ando |
| 5,612,964 A | | 3/1997 | Haraszti |
| 5,677,864 A | | 10/1997 | Chung |
| 5,698,997 A | | 12/1997 | Williamson et al. |
| 5,860,104 A | | 1/1999 | Witt et al. |
| 5,930,323 A | | 7/1999 | Tang et al. |
| 6,021,075 A | | 2/2000 | Ueno |
| 6,061,417 A | | 5/2000 | Kelem |
| 6,166,748 A | * | 12/2000 | Van Hook ................ A63F 13/00 345/522 |
| 6,239,638 B1 | | 5/2001 | Masuda |
| 6,327,175 B1 | | 12/2001 | Manapat et al. |
| 6,362,660 B1 | | 3/2002 | Deng |
| 6,411,230 B1 | | 6/2002 | Tauchen |
| 6,493,794 B1 | | 12/2002 | Yamashita |
| 6,526,505 B1 | | 2/2003 | Epstein |
| 6,560,696 B1 | | 5/2003 | Hummel |
| 6,678,806 B1 | | 1/2004 | Redford |
| 6,725,347 B2 | | 4/2004 | Yang |
| 6,745,216 B1 | | 6/2004 | Nakamura |
| 6,765,832 B1 | | 7/2004 | Ohtani |
| 6,820,186 B2 | | 11/2004 | Webber et al. |
| 6,834,005 B1 | | 12/2004 | Parkin |
| 7,027,338 B2 | | 4/2006 | Lee |
| 7,051,153 B1 | | 5/2006 | Lin et al. |
| 7,093,084 B1 | | 8/2006 | Leblanc |
| 7,228,391 B2 | | 6/2007 | Silvera et al. |
| 7,293,132 B2 | | 11/2007 | Hurley |
| 7,308,553 B2 | | 12/2007 | Liang |
| 7,463,056 B1 | | 12/2008 | Anderson |
| 7,502,896 B2 | | 3/2009 | Isani et al. |
| 7,508,701 B1 | | 3/2009 | Liang et al. |
| 7,570,611 B2 | | 8/2009 | Stone |
| 7,573,310 B2 | | 8/2009 | Yang et al. |
| 7,608,849 B2 | | 10/2009 | Ino et al. |
| 7,653,895 B1 | | 1/2010 | James-Roxby et al. |
| 7,722,839 B2 | | 5/2010 | Kuzyk |
| 7,728,327 B2 | | 6/2010 | Kim et al. |
| 7,791,376 B2 | | 9/2010 | Lim et al. |
| 7,864,560 B2 | | 1/2011 | Tran |
| 7,983,068 B2 | | 7/2011 | Ufert |
| 8,510,503 B2 | | 8/2013 | Yagihashi |
| 8,717,831 B2 | | 5/2014 | Hadley |
| 8,972,630 B1 | | 3/2015 | Stark |
| 2002/0089024 A1 | | 7/2002 | Iwata |
| 2002/0138715 A1 | | 9/2002 | Minematsu |
| 2002/0194401 A1 | | 12/2002 | Sakugawa |
| 2003/0147488 A1 | | 8/2003 | Nakamura |
| 2004/0019715 A1 | | 1/2004 | Apfeldorfer |
| 2004/0027863 A1 | | 2/2004 | Lee et al. |
| 2004/0201010 A1 | | 10/2004 | Ugajin |
| 2004/0205304 A1 | * | 10/2004 | McKenney ........... G06F 9/5016 711/148 |
| 2004/0239606 A1 | | 12/2004 | Ota |
| 2005/0127524 A1 | | 6/2005 | Sakamoto et al. |
| 2005/0138501 A1 | | 6/2005 | Motika et al. |
| 2005/0163277 A1 | | 7/2005 | Georgakos |
| 2006/0274585 A1 | | 12/2006 | Jung |
| 2007/0080345 A1 | | 4/2007 | Joo et al. |
| 2007/0083571 A1 | | 4/2007 | Meller et al. |
| 2007/0165446 A1 | | 7/2007 | Oliva et al. |
| 2007/0211531 A1 | | 9/2007 | Atti et al. |
| 2007/0262408 A1 | | 11/2007 | Takagi et al. |
| 2007/0267627 A1 | | 11/2007 | Joo et al. |
| 2007/0294469 A1 | | 12/2007 | Teruyama |
| 2008/0071748 A1 | | 3/2008 | Wroblewski et al. |
| 2008/0117700 A1 | | 5/2008 | Nakamura |
| 2008/0301256 A1 | * | 12/2008 | McWilliams ....... G06F 12/0284 709/214 |
| 2009/0010043 A1 | | 1/2009 | Gonzalez et al. |
| 2009/0193384 A1 | | 7/2009 | Sima et al. |
| 2009/0294869 A1 | | 12/2009 | Chen |
| 2009/0323445 A1 | | 12/2009 | Adams et al. |
| 2010/0023730 A1 | | 1/2010 | Leeland |
| 2010/0141322 A1 | | 6/2010 | Chua-Eoan |
| 2010/0164972 A1 | | 7/2010 | Akerib |
| 2010/0193824 A1 | | 8/2010 | Kim et al. |
| 2011/0022791 A1 | | 1/2011 | Iyer et al. |
| 2011/0026314 A1 | | 2/2011 | Hamouche et al. |
| 2011/0063893 A1 | | 3/2011 | Behera et al. |
| 2011/0085390 A1 | | 4/2011 | Arsovski et al. |
| 2011/0106742 A1 | | 5/2011 | Pino |
| 2012/0104346 A1 | | 5/2012 | Yi et al. |
| 2012/0138885 A1 | | 6/2012 | Wu et al. |
| 2013/0048950 A1 | | 2/2013 | Levy et al. |
| 2013/0106480 A1 | | 5/2013 | Ribeiro et al. |
| 2013/0282974 A1 | | 10/2013 | Joisha |
| 2014/0126309 A1 | | 5/2014 | Kelly |
| 2014/0297985 A1 | | 10/2014 | Graefe |
| 2014/0304467 A1 | | 10/2014 | Pickett |
| 2014/0310453 A1 | | 10/2014 | Golab |
| 2014/0379977 A1 | | 12/2014 | Perner |
| 2015/0006809 A1 | | 1/2015 | Harizopoulos |
| 2015/0046644 A1 | | 2/2015 | Karp |

FOREIGN PATENT DOCUMENTS

| | | |
|---|---|---|
| CN | 101336447 | 12/2008 |
| CN | 101594319 A | 12/2009 |
| CN | 101673804 | 3/2010 |
| EP | 0237337 A2 | 9/1987 |
| EP | 0827156 | 4/1998 |
| EP | 1617482 A2 | 1/2006 |
| GB | 2390179 | 12/2003 |
| JP | 63231798 | 9/1988 |
| JP | 5066921 | 9/1993 |
| JP | 2005071500 | 3/2005 |
| KR | 102006000619 | 1/2006 |
| WO | WO-9314459 | 7/1993 |

OTHER PUBLICATIONS

PCT; "Notification of Transmittal of The International Search Report and the Written Opinion of The International Searching Authority, or The Declaration" cited in PCT/US2011/058181; mailed Feb. 9, 2012; 8 pages.

(56) References Cited

OTHER PUBLICATIONS

Roberto Perez-Andrade et al., "A Versatile Linear Insertion Sorter Based on a FIFO Scheme," IEEE Computer Society Annual Symposium on VLSI, 2008, pp. 357-362.
Athanassoulis et al., MASM: Efficient Online Updates in Data Warehouses, ACM Special Interest Group on Management of Data Conference, Jun. 2011. 12 pages.
Boriskov, P.P. et al., Metal-insulator Transition in Electric Field: a Viewpoint from the Switching Effect, (Research Paper), Feb. 28, 2006, 18 Pages.
Chen, F. et al., S-shaped Negative Differential Resistance Modeling in Electro-thermal Simulation of Phase-change Memory Programming, (Research Paper), Non-Volatile Memory Technology Symposium, Nov. 10-13, 2007, pp. 67-70.
Chudnovskii, F.A. et al., Switching Phenomena in Chromium-doped Vanadium Sesquioxide, (Research Paper), Journal of Applied Physics, Sep. 1, 1998, pp. 2643-2646, vol. 84, No. 5.
European Patent Office, Communication pursuant to Rules 161(2) and 162 EPC for Appl. No. 11874746.8 dated Jun. 16, 2014 (3 pages).
Graefe, G., "B-tree Indexes, Interpolation Search,and Skew," IEEE Proceedings of the Second International Workshop on Data Management on New Hardware (DaMoN 2006), Jun. 25, 2006, Chicago, IL (10 pages).
Hikita, Y. et al., Negative Differential Resistance Induced by Mn Substitution at SrRuO3/Nb:SrTiO3 Schottky Interfaces, (Research Paper), Journals of American Physical Society, Mar. 19, 2008, vol. 77, No. 20., 14 Pages.
Supplementary European Search Report, Mar. 5, 2015, European Patent Application No. 11874593.4, 3 pages.
The International Bureau of WIPO, International Preliminary Report on Patentability for PCT/US2011/042223 dated Jan. 16, 2014 (5 pages).
The International Bureau of WIPO, International Preliminary Report on Patentability for PCT/US2011/058181 dated May 8, 2014 (5 pages).
U.S. Appl. No. 14/126,732, Non-Final Rejection dated Aug. 20, 2015, pp. 1-6 and attachments.
U.S. Appl. No. 14/126,732, Non-Final Rejection dated Dec. 10, 2014, pp. 1-5 and attachments.
U.S. Appl. No. 14/126,732, Notice of Allowance dated Apr. 28, 2015 (5 pages).
U.S. Appl. No. 14/126,732, Notice of Allowance dated Dec. 23, 2015 (5 pages).
Youn, D.H. et al., Observation of Abrupt Metallic Transitions in p-Type GaAs Devices and Comparison with Avalanche Breakdown in the InGaAs APD, (Research Paper), Journal of the Korean Physical Society, Jul. 1, 2005, vol. 47, No. 1 (5 pages).
Bender et al., Insertion Sort is O (n log n), In Proceedings of the Third International Conference on FunWith Algorithms (FUN), 2004 (6 pages).
Chudnovskiy, F. et al., "Switching Device Based on First-order Metalinsulator Transition Induced by External Electric Field," IEEE Future Trends in Microelectronics: the Nano Millennium, Wiley Interscience, 2002, pp. 148-155.
European Patent Office, Extended EP Search Report, Application No. 11868835.7-1805 dated Feb. 3, 2015 (8 pages).
Han et al., Integer Sorting in (n $\sqrt{}$loglog n) Expected Time and Linear Space, 2002 (10 pages).
IEEE P1003.1, Draft 6, Apr. 2001/Open Group Technical Standard, Issue 6, Draft Standard for Information Technology—Portable Operating System Interface (POSIX) (23 pages).
Mikkel Thorup, Chapter 1—On RAM priority queues, 1996 (9 pages).
PCT Search Report, PCT/US2011/058461, May 31, 2012, 3 Pages.
PCT Search Report/Written Opinion~Application No. PCT/US2011/042223 dated Jan. 2, 2012~8 pages.
Pickett et al., "Coexistence of Memristance and Negative Differential Resistance in a Nanoscale Metal-Oxide-Metal System," IEEE Advanced Materials, 2011, pp. 23, 1730-1733.
Stephen C. Johnson, Algorithms for the 21st century presented at the 2006 USENIX Annual Technical Conference, Boston, MA, vol. 31, No. 5 (7 pages).
International Searching Authority, The International Search Report and the Written Opinion, Feb. 9, 2012, 8 Pages.
International Searching Authority, The International Search Report and the Written Opinion, Feb. 9, 2012, 9 Pages.
International Searching Authority, The International Search Report and the Written Opinion, Jan. 17, 2013, 10 Pages.
International Searching Authority, The International Search Report and the Written Opinion, Nov. 28, 2012, 9 Pages.
International Searching Authority, The International Search Report and the Written Opinion, May 31, 2012, 10 Pages.
U.S. Appl. No. 14/349,678, Non-Final Rejection dated Oct. 14, 2015, pp. 1-25 and attachments.

* cited by examiner

| 00 | 01001000 |
| 01 | 01111000 |
| 02 | 11001000 |
| 03 | 01001110 |
| 04 | 11001010 |
| 05 | 01001010 |
| 06 | 11111011 |
| 07 | 00000001 |
| 08 | 11011011 |
| 09 | 01101111 |
| 10 | 11101011 |
| 11 | 01111010 |

| 00 | 01001000 |
| 01 | 01111000 |
| 02 | 11001000 |
| 03 | 01001110 |
| 04 | X |
| 05 | 11001010 |
| 06 | 01001010 |
| 07 | 11111011 |
| 08 | 00000001 |
| 09 | 11011011 |
| 10 | 11101011 |
| 11 | 01111010 |

*FIG. 1A*

| 00 | abc |
| 01 | def |
| 02 | ghi |
| 03 | jkl |
| 04 | mno |
| 05 | pqr |
| 06 | stu |
| 07 | vwx |
| 08 | yza |
| 09 | bcd |
| 10 | efg |
| 11 | hij |

| 00 | abc |
| 01 | def |
| 02 | jkl |
| 03 | mno |
| 04 | pqr |
| 05 | stu |
| 06 | X |
| 07 | vwx |
| 08 | yza |
| 09 | bcd |
| 10 | efg |
| 11 | hij |

*FIG. 1B*

```
       0000000000000000 1111111111111111
LEN    0000000011111111 0000000011111111

0000111100001111 0000111100001111
ADDR   0011001100110011 0011001100110011
       0101010101010101 0101010101010101

W_0    1000000010000000 1000000010000000
W_1    0100000011000000 1100000011000000
W_2    0010000001100000 1110000011100000
W_3    0001000000110000 0111000011110000
W_4    0000100000011000 0011100001111000
W_5    0000010000001100 0001110000111100
W_6    0000001000000110 0000111000011110
W_7    0000000100000011 0000011100001111
```

SHIFTABLE MEMORY SUPPORTING ATOMIC OPERATION

CROSS-REFERENCE TO RELATED APPLICATION

This application is a national stage application under 35 U.S.C. §371 of PCT/US2011/058181, filed Oct. 27, 2011.

STATEMENT REGARDING FEDERALLY SPONSORED RESEARCH OR DEVELOPMENT

N/A

BACKGROUND

Modern computers and related processing systems typically include a processor and some form of memory. The processor is generally responsible for performing the various computational tasks of the computer while the memory stores data that is used in and generated by the computational tasks. The architectural division of processing by the processor and data storage by the memory has proven successful for nearly the entire history of such systems.

For example, a typical general-purpose computer usually includes a central processing unit (CPU) and a main memory that communicate with one another over one or more communication channels (e.g., data, command and address buses). Typically, the CPU provides facilities to perform various arithmetic and logical operations, to provide operational sequencing, and to otherwise control aspects of the general-purpose computer. For example, virtually all CPUs provide functions or operations for reading data from memory, writing data to memory and executing programs comprising a set of instructions that utilizes the data to perform a predefined task. In addition, CPUs may handle input/output (I/O) allowing communication with peripherals as well as subsystems outside of the general-purpose computer. CPUs may even provide graphics processing to handle generating and updating a graphical display unit (e.g. a monitor), in some examples.

In contrast, the main memory of modern computers, which can include one or more of static random access memory (SRAM), dynamic random access memory (DRAM), read-only memory (ROM), programmable ROM (PROM), flash memory and a variety of other memory types, typically provides a relatively narrow set of capabilities. Principal among these capabilities is storing computer programs and data that are executed and used by the CPU. Among other limited capabilities that may be found in or that are often associated with the main memory of modern computers are certain memory management functions. For example, DRAM memory subsystems of main memory may possess circuitry for automatic refresh of data stored therein.

However, the historical architectural division of processing in the processor and storage in memory does present certain problems that are becoming more and more evident as time goes on. In particular, the conventional architectural division that centralizes all processing in the CPU while relegating the main memory to providing storage can and does present problems, especially as the memory is shared or used concurrently by one or both of multiple processes (e.g., threads) and multiple processors. Such concurrent processing systems, whether multi-threaded, multi-processor, or both, can present serious synchronization problems when considering shared and concurrently used main memory.

BRIEF DESCRIPTION OF THE DRAWINGS

Various features of examples in accordance with the principles described herein may be more readily understood with reference to the following detailed description taken in conjunction with the accompanying drawings, where like reference numerals designate like structural elements, and in which:

FIG. 1A illustrates an example of a downshift of a contiguous subset of data stored in a linear array within a shiftable memory, according to an example in accordance with the principles described herein.

FIG. 1B illustrates an example of an upshift of a contiguous subset of data stored in a linear array within a shiftable memory, according to an example in accordance with the principles described herein.

Figures 2, 3:
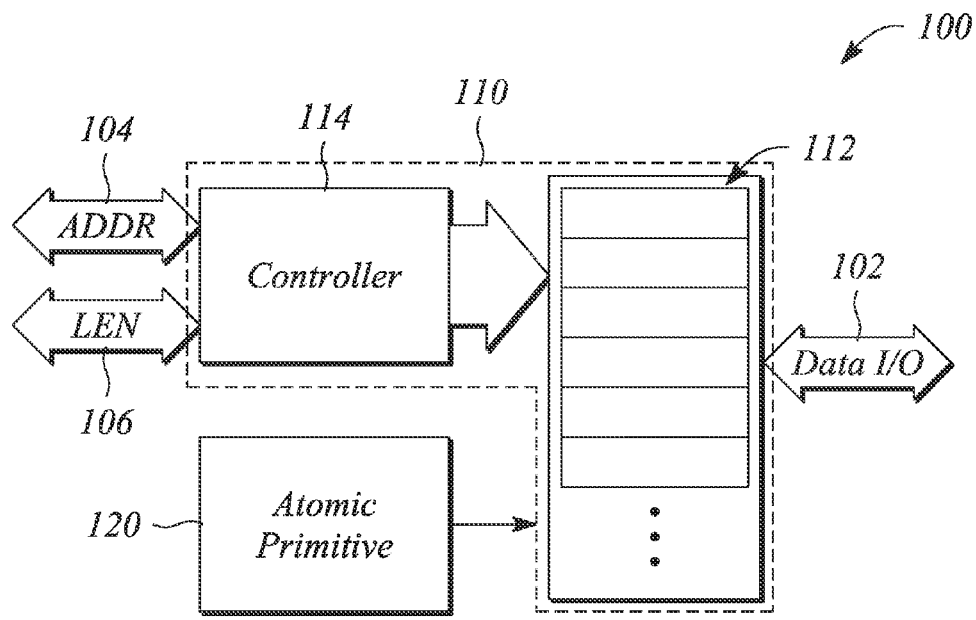
FIG. 2 illustrates a block diagram of a shiftable memory supporting atomic operation, according to an example in accordance with the principles described herein.
FIG. 3 illustrates a truth table of an augmented decoder, according to an example in accordance with the principles described herein.

Certain examples have other features that are one of in addition to and in lieu of the features illustrated in the above-referenced figures. These and other features are detailed below with reference to the above-referenced figures.

DETAILED DESCRIPTION

Examples in accordance with the principles described herein support atomic operation of memory with data shifting capability. In particular, the data shifting capability is substantially built into the memory, according to various examples of the principles described herein. The built-in data shifting capability provides a lateral translation or shift of a contiguous subset of data stored in the memory while the atomic operation facilitates concurrent use of the memory by more than one process or processor. Examples herein have application to a variety of multi-processor and multi-threaded systems.

According to various examples, the contiguous subset of stored data (e.g., data words) may be shifted within the memory from a first memory location to a second memory location. The data retain an ordered relationship within the contiguous subset when shifted to the second location, according to some examples. Moreover, the shift takes place entirely within the memory and the shift is generally accomplished without using resources, such as a processor, that are outside of the memory. Further, the shift does not involve data being moved between a processor and the memory, according to various examples. As a result, the memory with built-in shifting capability is referred to as 'shiftable memory' herein.

In some examples, the shift provided by the shiftable memory herein may be employed to 'open' a location in memory into which a new data may be inserted. In particular, during an atomic operation a memory location either above or below the contiguous subset of stored data be rendered available for data insertion when the contiguous subset of stored data is moved by the shift within the shiftable memory. Then data may be added or appended as a further part of the atomic operation, for example.

According to other examples, the shift may be used to delete or 'overwrite' data stored one of above a beginning of the contiguous subset and below an end of the contiguous subset. In particular, during an atomic operation the data stored above or below the contiguous subset may be overwritten with a portion of the contiguous subset itself, when the contiguous data is shifted by the shiftable memory. For example, if the contiguous subset of stored data is part of a larger data structure (e.g., an array of data words) in the shiftable memory, the shift may have the effect of deleting a portion of the data (e.g., one or more data words) in the larger data structure as part of the atomic operation.

According to some examples, shifting data to either insert data or delete data in the shiftable memory may be accomplished in less time, and in some examples in considerably less time, than is generally possible without using shiftable memory. In fact, the shift may be accomplished substantially within a single atomic step using shiftable memory, according to various examples.

In contrast, conventional memory that relies on a processor, for example, to perform a shift generally requires an amount of time that is proportional to an amount of data being shifted. For example, shifting data in conventional memory typically involves the processor reading the data to be shifted and then writing the data back to memory in another location. Reading and writing may be performed by the processor on a word-by-word basis due to the structure and functionality of conventional memory, for example. Since each data word in the data being shifted is first read from the conventional memory by the processor and then subsequently written back to the conventional memory, the time to shift the data is generally proportional to the amount or length of the data (e.g., number of data words) being shifted, for example. The larger the amount of data, the longer the shift operation will take.

Moreover, conventional memory relies on a resource (e.g., the processor) that is external to the conventional memory to perform the reading and writing when shifting the data. Since the resource performing the shift is external to the conventional memory, each of the data words involved in the word-by-word shift must pass between the external resource and the conventional memory through some form of data bus or similar communication channel. The data bus or similar communication channel may substantially limit a speed of the read and write operations and as a result, an overall speed of the shift. Hence, shifting large subsets of data can become prohibitively expensive in terms of the processing time due to one or both of the effects of data bus speed and the proportional time aspects of performing a shift using conventional memory.

In accordance with the principles described herein, shiftable memory has built-in shifting capability so that data is not read and then written by an external resource to perform a shift, for example. The contiguous subset of stored data is identified to the shiftable memory (e.g., using an address and a length) and the shiftable memory is instructed to shift the contiguous subset. The shift is then accomplished by and takes place entirely within the shiftable memory. Speed limitations associated with transferring data to and from an external resource are substantially eliminated by shiftable memory, according to examples of the principles described herein. Moreover, time for shifting may be substantially independent of the length of the contiguous subset, for example.

According to various examples, shifting within the shiftable memory may be implemented with circuitry of the shiftable memory itself. As such, shifting using shiftable memory does not require sequentially reading and writing each data word of the contiguous subset. For example, shifting using shiftable memory may shift all of the data in the contiguous subset in a substantially simultaneous manner. As such, the shiftable memory may implement shifting of the contiguous subset in a time that is substantially independent of the length of the contiguous subset.

In some examples, the shiftable memory may perform the shift in substantially constant time, according to the principles described. Moreover, the shiftable memory supporting atomic operation may accomplish the shift in a single atomic step of the system employing the shiftable memory. By 'constant time' it is meant that a substantially similar amount of time is required to shift the contiguous subset of stored data regardless of the length of the contiguous subset. For example, an arbitrary length contiguous subset may be shifted in a single clock cycle, according to some examples. In another example, a shorter contiguous subset may need only a single clock cycle while a longer contiguous subset may require two or more clock cycles. However, while the shiftable memory may use more time for longer subsets than relatively shorter subsets, the shift is still performed in substantially constant time since the time required is not strictly proportional to the contiguous subset length.

Herein, the term 'memory' refers to any sort of memory that can receive and store data. The memory is generally consistent with memory that may be employed by a computer processor or in a computer system, for example. In particular, by definition herein, memory refers to any sort of memory that can be written to and read from during operation of the computer that employs the memory. For example, the memory may comprise random access memory (RAM). The random access memory may be static RAM (SRAM), for example. Other types of memory include, but are not limited to, dynamic random access memory (DRAM), flash and similar non-volatile memories that are writable during operation of the computer, various forms of optical memory (e.g., re-writable optical discs), magnetic memory (e.g., computer hard drives) and various memory structures based on latches, flip-flops and other bi-stable constructs.

Also herein by definition, a memory may comprise a plurality of groups of memory cells. A plurality of memory cells may be also be arranged as an array, according to some examples. For example, the memory cells may be arranged as a linear array. In another example, the memory cells are arranged in a two dimensional (2-D) array. Higher order (e.g., three or more dimensions) arrays also may be employed. In some examples, a lower order array (e.g., a linear array) is defined on an array with a larger dimension (e.g., 2-D array). For example, a linear array may be defined by an addressing arrangement on a rectangular 2-D array of memory cells. In addition, arrays may be divided into sub-arrays. For example, a 2-D array may be divided into quadrants as four sub-arrays. According to various examples, the array may be either a physical array or a logical array. A physical array comprises memory cells that are physically organized or located relative to one another according to or as defined by the array. A logical array comprises a logical arrangement of the memory cells as an array. In a logical array, a physical arrangement of the memory cells may differ from the logical arrangement defined by the array, for example. Logical arrays may be defined using address indirection, for example.

A memory cell is a circuit or related construct that holds or stores data, as defined and employed herein. Further, by definition herein, memory cells may store one or more 'bits' of data. For example, the bit may be a binary value (e.g., '0' or '1') and the memory cell may hold a single bit. In another example, the memory cell may hold a plurality of binary value bits. In particular, the memory cell may hold or store a complete data word comprising the plurality of bits, as defined herein. For example, a memory cell may hold 4, 8, 16, 32 or 64 binary bits. In yet another example, the memory cell may hold data in another form (e.g., a hexadecimal value, an analog value, etc.). In particular, memory cells, as defined herein, are not restricted to storing data in a binary format but may, in some examples, hold or store an arbitrary data construct. However, for discussion purposes herein, binary data is generally employed throughout by way of example and not by way of limitation, unless otherwise stipulated.

As used herein, a 'register' or equivalently 'memory register' is defined as a collection or grouping of memory cells. Further herein, a register comprising a grouping of memory cells may hold data (e.g., a plurality of data bits) that constitute the data word of a particular computer system. Hence, the contents of a register are generally referred to as a 'data word,' herein. In some examples, the memory cells of a memory register are physically adjacent to one another. For example, a first memory cell of a memory register may be located immediately next to a second memory cell of the memory register. In other examples, the memory cells of a memory register are logically related instead of or in addition to being physically collocated. In particular, adjacent memory cells may not be necessarily physically adjacent to be logically adjacent, in some examples.

Memory cells are also often referred to as 'memory locations' herein. Strictly speaking, a memory location is a memory cell(s) at a particular location within the memory, the location being designated or identified by an address. The memory cell is accessed using the address, for example. However, for simplicity of discussion herein, memory cells are generally referred to as having or being at an address. Addresses or locations may be associated with a shiftable unit (e.g., a data word) of the memory, for example. As such 'location' and address may be employed interchangeably herein. In addition 'location' may be used to refer to a location of a contiguous set of data that is designated by a starting address and an ending address, according to some examples. In other examples, the location of the contiguous set may be designated by a starting (or an ending) address and a length of the contiguous set.

Adjacent memory cells as defined by adjacent memory locations may be physically adjacent (i.e., located next to one another) or logically adjacent, by definition herein. Logical adjacency be established by an overlying logical memory structure (e.g., using indirection), according to some examples. For example, logically adjacent memory cells may be physically separated from one another but still be considered adjacent in terms of an overlying memory structure that employs interleaving. Likewise, the contiguous subset may be physically contiguous (i.e., located in physically adjacent memory cells) or logically contiguous. In particular, the contiguous subset of data as stored in the adjacent memory cells of the shiftable memory acquires a contiguity that is analogous to and dictated by the adjacency of the memory cells, by definition herein.

Further herein and as noted above, a shift as performed by shiftable memory is defined as a lateral translation of a contiguous subset of data stored within the memory, unless otherwise stipulated. In particular, by definition herein, a shift using shiftable memory constitutes the lateral translation (e.g., up or down an array) of the stored data (e.g., data words) within the contiguous subset from a first location to a second location within the memory. Furthermore, the shift, when applied to the contiguous subset of stored data, translates all of the stored data within the contiguous subset. Moreover, the shift by shiftable memory does not result in a lateral translation or shift of data outside of the subset of data involved in the shift, by definition herein. In general, the shift may move the data by a distance of one or more memory locations or memory addresses. For example, the shift may move the data a single memory location up or down within the memory.

Herein, the direction 'up' is defined with respect to memory locations within the shiftable memory as a direction toward locations having smaller addresses. The direction 'down' is defined as a direction toward locations having larger addresses. Hence, an 'upshift' is defined as shifting the data to a second location having a smaller address than an address of a first or starting location. Conversely, a 'downshift' results in moving the data from a first location having a smaller address to a second location with a larger address. However, while the shift direction is controllable or selectable according to some examples, the shift direction (e.g., up or down) may be completely arbitrary with respect to the physical address space, as employed herein. Further, the specific use of 'upshift' and 'downshift' herein is for discussion purposes and not by way of limitation.

FIG. 1A illustrates an example of a downshift of a contiguous subset of data stored in a linear array within a shiftable memory, according to an example of the principles described herein. In particular, FIG. 1A illustrates a plurality of memory cells, each of which is capable of storing a data word. For example, the data words may comprise eight binary bits, each bit (e.g., either a '1' or '0') being stored in a separate one of eight memory cells. Further as illustrated, each of the illustrated memory cells is identified by an address ranging from 00 to 11. A left side of FIG. 1A illustrates the plurality of memory cells before the downshift while a right side illustrates the same plurality of memory cells after the downshift.

As illustrated, the example downshift within the shiftable memory comprises selecting a contiguous subset of stored data words starting with a memory cell at address 04 and ending with a memory cell at address 08, for example. The selected contiguous subset contains data words {11001010, 01001010, 11111011, 0000001, 11011011} in the illustrated example. The shiftable memory then downshifts the selected contiguous subset of data words by moving the stored data words down one address location, as illustrated in the right side of FIG. 1A. The downshift maintains an order of the data words within the contiguous subset and deposits the contiguous subset in memory cells between address 05 and address 09. Downshifting the stored data overwrites the contents of a memory cell immediately below the contiguous subset (i.e., at address 09) and replaces the contents of that memory cell with a last data word (i.e., '11011011') of the downshifted contiguous subset. Further, the memory cell at address 04 which originally held the first data value of the contiguous subset is rendered indeterminate as indicated by the 'X'. According to various examples, the memory cell at address 04 may retain a copy of the data word (e.g., '11001010') that was present before the downshift or may be cleared (e.g., set to '00000000') after the downshift.

In some examples, the memory cell at address 04 may be available for insertion of a data word from an external source, for example. A data word may be inserted into the memory cell at address 04 by sequentially presenting and clocking or shifting individual bits of the inserted data word into the memory cells of the memory cell at address 04 (e.g., a serial write), according to some examples.

FIG. 1B illustrates an example of an upshift of a contiguous subset of data stored in a linear array within a shiftable memory, according to an example of the principles described herein. In particular, FIG. 1B illustrates a plurality of memory cells each of which stores a data word (e.g., 'abc,' 'def,' etc.). Further as illustrated, each of the illustrated memory cells is identified by an address ranging from 00 to 11. A left side of FIG. 1B illustrates the plurality of memory cells before the upshift while a right side illustrates the same plurality of memory cells after the upshift.

As illustrated in FIG. 1B, the upshift shiftable memory comprises selecting a contiguous subset of stored data words starting with a memory cell at address 03 and ending with a memory cell at address 06, for example. The shiftable memory then upshifts the selected contiguous subset by moving the stored data words in the selected contiguous subset up one address location, as illustrated in the right side of FIG. 1B. The upshift maintains an order of the words within the contiguous subset and deposits the contiguous subset in memory cells between address 02 and address 05. Upshifting the stored data words overwrites the contents of a memory cell immediately above the contiguous subset (i.e., at address 02) replacing the contents of that memory cell with a first word (i.e., 'jkl') of the upshifted contiguous subset. Further, the memory cell at address 06 which originally held the last word of the contiguous subset is rendered indeterminate as indicated by the 'X'. According to some examples, the memory cell at address 06 may retain a copy of the data word (e.g., 'stu') that was present before the upshift or may be cleared (e.g., set to '000') after the upshift. In some examples, the memory cell at address 06 may be available for insertion of data from an external source, for example.

According to various examples, the shiftable memory may be a portion of a main memory of a general-purpose computer system. The shiftable memory may represent a subset of the memory that makes up the main memory, for example. Furthermore according to various examples, the shiftable memory is distinct from memory cells, cache and other relatively small memory structures often found integrated together with other components (e.g., an arithmetic logic unit, controller, etc.) in a microprocessor, for example. In particular, shiftable memory by definition herein is part of the main memory and as such, is separate from a processor of a general-purpose computer system or related processing system, according to various examples. In addition, shiftable memory typically contains an order of magnitude or more memory storage than is present or can be present in the processor, according to some examples. For example, shiftable memory may include many megabytes or even gigabytes of memory storage whereas processor memory storage typically may be limited to less than a few tens of bytes (e.g., processor registers) to a few megabytes (e.g., L1 cache, L2 cache etc.). According to some examples, the shiftable memory may be a specialized partition of the main memory or a subsystem thereof.

Herein, atomic operation refers to operations and actions performed in a manner that is uninterruptible and therefore appears substantially instantaneous to a process or processor of a system. In particular, by definition herein, an atomic operation is substantially indivisible or uninterruptable by processes and processors of the system. Hence, an atomic operation will be executed completely (reach termination) without any other process being able to read or change a state, a variable or an element of or that is accessed by the atomic operation, by definition. Further, the atomic operation is said to be accomplished during an 'atomic step,' by definition herein. From the standpoint of concurrent processes or a plurality of processors of the system, accomplishing the atomic operation in an atomic step ensures that no two processes or processors have simultaneous access to elements (e.g., registers, memory, etc.) of the atomic operation. An atomic primitive is defined as a function or process that performs an atomic operation within a system. As such, atomic primitives used herein may substantially simplify synchronization between threads in a concurrent, multi-threaded system. Furthermore, the atomic primitives employed by examples of the principles described herein may reduce or even eliminate the need for various other synchronization methodologies including, but not limited to, locks and non-blocking techniques that may result in high overhead and other detrimental effects. In some examples, an atomic step may not be substantially equivalent to a clock cycle or a machine instruction step. For example, the atomic step may involve N clock cycles, where N is an integer greater than one (e.g., N=2, 3, or 4 and so on).

Further, as used herein, the article 'a' is intended to have its ordinary meaning in the patent arts, namely 'one or more'. For example, 'a memory cell' means one or more memory cells and as such, 'the memory cell' means 'the memory cell(s)' herein. Also, any reference herein to 'top', 'bottom', 'upper', 'lower', 'up', 'down', 'front', 'back', 'left' or 'right' is not intended to be a limitation herein. Herein the term 'about' when applied to a value generally means within the tolerance range of the equipment used to produce the value, or in some examples, means plus or minus 10%, or plus or minus 5%, or plus or minus 1%, unless otherwise expressly specified. Moreover, examples herein are intended to be illustrative only and are presented for discussion purposes and not by way of limitation.

FIG. 2 illustrates a block diagram of a shiftable memory 100 supporting atomic operation, according to an example of the principles described herein. The shiftable memory 100 provides shifting of a contiguous subset of data in the shiftable memory 100. Shifting of data by the shiftable memory 100 shifts only the data in the contiguous subset and not other data outside of the contiguous subset. In particular, when the shiftable memory 100 performs a shift of the contiguous subset, only data of the contiguous subset is affected, according to various examples. The shift does not shift other data located outside of the contiguous subset, for example. Further, the shift moves the contiguous subset of data without substantially changing or otherwise affecting an order of the data in the contiguous subset, according to some examples. Additionally, the shiftable memory 100 supports atomic operation using one or more atomic primitives defined on the shiftable memory 100. Atomic operation facilitates use in a concurrent threaded processing environment, for example.

In some examples, an external resource (e.g., a processor) communicates data to and from the shiftable memory 100 via a data bus (Data I/O) 102. For example, data to be stored in the shiftable memory 100 may be communicated from the external resource to the shiftable memory 100 via the data bus 102. Similarly, data that is stored in and subsequently read from the shiftable memory 100 may be communicated to the external resource from the shiftable memory 100 via the data bus 102, for example. Information used to control an operation of the shiftable memory 100 such as, but not limited to, an address and a length of the contiguous subset may be communicated to the shiftable memory 100 using an address bus (ADDR) 104 and a length bus (LEN) 106, according to some examples. A single address bus that carries both the address and the length or alternatively, a pair of addresses, may be employed in other examples (not illustrated).

As illustrated, the shiftable memory 100 supporting atomic operation comprises a memory 110 to store data. The memory 110 has built-in shifting capability to shift a contiguous subset of the data from a first location to a second location within the memory. In particular, the built-in shifting capability is configured to shift the contiguous subset of data substantially within the memory 110. During the shift, the data is not transferred out of the memory 110 to accomplish the shift, according to various examples. For example, the second location may represent a shift relative to the first location of a single unit of data (e.g., a data word). The shift may be accomplished by moving data along pathways within the memory 110 from the first location to an adjacent location of the memory 110 representing the second location, for example. Moving data to the adjacent location is referred to as an 'adjacent-location transfer,' herein. In another example, the shift may move the contiguous subset of data by more than one data unit (e.g., two or more data words). A shift of two or more data units may be accomplished by a direct shift using internal data pathways of the memory 110 from the first location to the second location that is two or more data units distant from the first location, for example. In other examples, the memory 110 having built-in shifting capability may move the data in a series of smaller steps (e.g., a plurality of adjacent-location transfers) to achieve the shift of more than one data unit. However, in each example, a built-in shifting capability of the memory 110 accomplishes the shift substantially without relying on or employing a transfer of the data in and out of the memory 110, according to various examples of the principles described herein.

According to some examples, the memory 110 comprises a plurality of memory cells 112 configured as an aggregate to store data. In some examples, the stored data may correspond to a data word. In some examples, the memory cells 112 are configured to store binary data. In some examples, each memory cell 112 is configured to store a single bit of binary data (e.g., as a '1' or '0'). In other examples, each memory cell 112 is configured to store a plurality of binary data bits. For example, each memory cell 112 may store a data word. In particular, according to some examples, each memory cell 112 comprises a plurality of memory locations configured as an aggregate to store data bits corresponding to the data word. The plurality of data bits of the data word defines a width of the memory cell 112. In other examples, the memory cell 112 may store the data in a form other than as one or more binary bits.

According to various examples, the memory 110 may be implemented using substantially any memory technology. For example, memory cells of the memory 110 may be implemented using static random access memory (SRAM) memory cells 112. In another example, one or more flip-flops such as, but not limited to, a D flip-flop, may be employed to implement the memory cells 112 of the memory 110. In other examples, yet another memory technology (e.g., DRAM, memristors, etc.) may be used to implement the memory cells 112 of the memory 110.

According to some examples, the memory 110 further comprises a controller 114. The controller 114 is configured to select a contiguous subset of the stored data. The controller 114 is further configured to control shifting of the selected contiguous subset from a first location to a second location within memory 110. The selected contiguous subset has a length that is less than a total length of the memory 110, according to various examples of the principles described herein. Using one or more control signals, the controller 114 may cause the memory 110 to shift the selected contiguous subset by instructing the memory 110 to perform the shift, for example.

In various examples, the memory 110, or more generally the shiftable memory 100, facilitates one or both of an upshift and a downshift of the contiguous subset of data (e.g., data words). In particular, a memory cell 112 of the second location within the memory 110 may be located either above or below a corresponding memory cell 112 of the first location, depending on a direction of the shift. In some examples, the memory cell 112 of the second location is a single memory cell (or memory location) away from the corresponding memory cell 112 of the first location. In other words, the shift represents movement of the contiguous subset of stored data by a single memory location or address. In other examples, the second location represents a movement of more than a single memory cell 112. For example, the data words may be stored as a linear array of bits within the shiftable memory and the shift may be a number of bits equal to a length of the data word in bits.

In some examples, the selected contiguous subset is specified by both of an address of a first memory cell 112 of the contiguous subset and an address of a last memory cell 112 in the contiguous subset. For example, the first memory cell address and the last memory cell address are communicated to the controller 114 (e.g., via an address bus) to facilitate selecting the contiguous subset. The first memory cell address and last memory cell address may be communicated either sequentially as a first address followed by a second address over a single bus (e.g., ADDR 104), according to various examples. Alternatively, the first and last addresses may be communicated in parallel as two simultaneous addresses either over two buses or over two portions of a single, wide bus, for example.

In another example, the selected contiguous subset is specified by an address of the first memory cell 112 and a length of the contiguous subset (e.g., via ADDR 104 and LEN 106, as illustrated). In some of these examples, the length may be the length of the contiguous subset that follows the first memory cell 112 such that the last memory cell address is given by a sum of the first memory cell address and the length. In other examples, the length includes the first memory cell 112 such that the last memory cell address is given by the first memory cell address plus the length minus one. Other examples may specify the last memory cell address and the length of the contiguous subset that precedes the last memory cell, as well as other schemes, for example.

In some examples, the controller 114 comprises an augmented decoder. The augmented decoder employs information regarding the address and length (or alternatively the first and last memory cell addresses) to select the contiguous subset of stored data. In some examples, the augmented decoder uses the information (e.g., address and length of the contiguous subset) to assert an output corresponding to each of the memory cells of the selected contiguous subset within the memory 110. Asserting an output may comprise outputting a logic '1' on a connection path or wire (e.g., a word line W) between the augmented decoder and the plurality of memory cells 112, for example. As such, the augmented decoder may output a logic '1' on a plurality of word lines of the memory 110, the word lines corresponding to the memory cells 112 that contain the stored data of the selected contiguous subset. The word lines may be connected to a load enable (LE) input or a select (SEL) input of the memory cells 112, for example. In other examples, asserting an output comprises outputting a logic '0.' Asserting a logic '0' may be used when the memory cells 112 have a 'not' load enable ($\overline{LE}$) input or a 'not' select ($\overline{SEL}$) input, for example.

In some examples, the augmented decoder is further configured to assert an additional output corresponding to one of a memory cell 112 adjacent to and immediately above the selected contiguous subset or a memory cell 112 adjacent to and immediately below the selected contiguous subset. For example, the additional output corresponding to the memory cell 112 immediately above the selected contiguous subset may be asserted when the stored data is to be upshifted within the memory 110. The additional output corresponding to the memory cell 112 immediately below the selected contiguous subset may be asserted when the stored data is to be downshifted within the memory 110, for example. In particular, the additional output may be used to enable the memory cell 112 that receives stored data from either the first memory cell 112 or the last memory cell 112 of the contiguous subset of data.

FIG. 3 illustrates a truth table of an augmented decoder, according to an example of the principles described herein. In particular, the augmented decoder corresponding to the illustrated truth table is configured to select the contiguous subset in an example memory 110 having eight memory cells 112. The truth table has three address inputs (ADDR), a length (LEN) input and eight word lines W (i.e., $W_0$-$W_7$). The eight word lines W may correspond to load enable (LE) inputs of eight memory cells 112 in the example memory 110, for example. As can be seen in the truth table, for a value of LEN equal to '00', the augmented decoder functions substantially similar to a conventional decoder (i.e., only one word line W is asserted at a time). However, a plurality of word lines W are asserted for all other values of LEN to facilitate simultaneous enabling of a corresponding plurality of memory cells 112 that hold or store the selected contiguous subset of stored data to be shifted.

In some examples, the augmented decoder may be implemented using a read only memory (ROM). The ROM is programmed with a truth table that specifies the functionality of the augmented decoder. A decoder of the ROM decodes an input (e.g., ADDR and LEN) and the programmed connections within the ROM augment the output of the ROM decoder to produce the augmented decoder functionality, for example. In another example, a conventional decoder may be augmented with an output circuit other than the programmed connections to implement the augmented decoder. In yet another example, the augmented decoder may be implemented using a latched ripple cascade.

Referring back to FIG. 2, the shiftable memory 100 supporting atomic operation further comprises an atomic primitive 120 defined on the memory 110. The atomic primitive 120 is configured to operate on the contiguous subset. In some examples, the atomic primitive 120 is implemented as software or firmware (e.g., computer code or instructions) that is stored in a computer readable media and executed by a processor. The computer readable media may include, but is not limited to, various forms of computer memory (e.g., RAM, ROM, flash memory, etc.), a magnetic disk, and an optical disk of a computer system. The software or firmware may be executed by a processor that is part of a concurrent multithreaded system that employs the shiftable memory 100, for example.

In another example, the atomic primitive 120 is implemented in hardware. For example, the atomic primitive 120 may be implemented as a machine code instruction of a processor (e.g., a microprocessor) that employs the shiftable memory 100. In another example, the atomic primitive 120 may be one or both of implemented within and collocated with circuitry of the shiftable memory 100, itself. For example, the atomic primitive 120 may be implemented as logic circuits that are part of the controller 114. In another example, the atomic primitive 120 is implemented as an application specific integrated circuit (ASIC) that operates along side the controller 114, for example. In yet other examples, the atomic primitive 120 may be implemented as part of a memory controller (not illustrated) that supports and provides an interface to the shiftable memory 100 as part of a memory subsystem. However, while the atomic primitive 120 may be implemented remote from other portions of the shiftable memory 100, the atomic primitive 120 is considered an element of the shiftable memory 100 by virtue of being defined on the memory 110 and being configured to operate on a contiguous subset of data within the memory 110, according to some examples.

In some examples, the atomic primitive 120 comprises a shift-and-store primitive. The shift-and-store primitive is configured to downshift the contiguous subset in the memory using the built-in shifting capability. The shift-and-store primitive is further configured to add or append data onto a beginning of the contiguous subset. The shift-and-store primitive may be substantially similar in operation to a push-onto-stack operation where the contiguous subset represents a stack (e.g., of depth k), albeit utilizing shiftable memory 100, according to some examples.

In some examples, the shift-and-store primitive may be represented as a function shift-and-store (A, k, v). A parameter A of the function shift-and-store (A, k, v) designates a location of the contiguous subset in the memory 110. For example, parameter A designates the contiguous subset (e.g., as an array A). The parameter A may be an address of the contiguous subset, while the parameter k defines a length of the contiguous subset, for example. In some examples, the parameter k may be an integer representing the length. In a representation, parameter A may be denoted A[.] such that A[0 ... k−1] represents an array of k elements where a first element of the array is denoted A[0], a second element is denoted A[1], and so on until a last element denoted A[k−1]. In another example, the parameter k may be an address of a register that stores the length of the contiguous subset. In yet another example, the parameter k is replaced by a parameter K that indicates an end or bottom of the contiguous subset. According to various examples, the parameter K may be a pointer to or an address of the bottom, an address of a register that contains the address of the bottom, or another similar means of identifying the bottom. In yet other examples, the bottom identified by the parameter k (or equivalently the parameter K) may be a bottom of a stack or a similar portion of the contiguous subset as opposed to a bottom of the contiguous subset itself. The parameter v represents a value (e.g. one or more data words) that is stored in the contiguous subset by the shift-and-store primitive, for example.

Figure 4A:
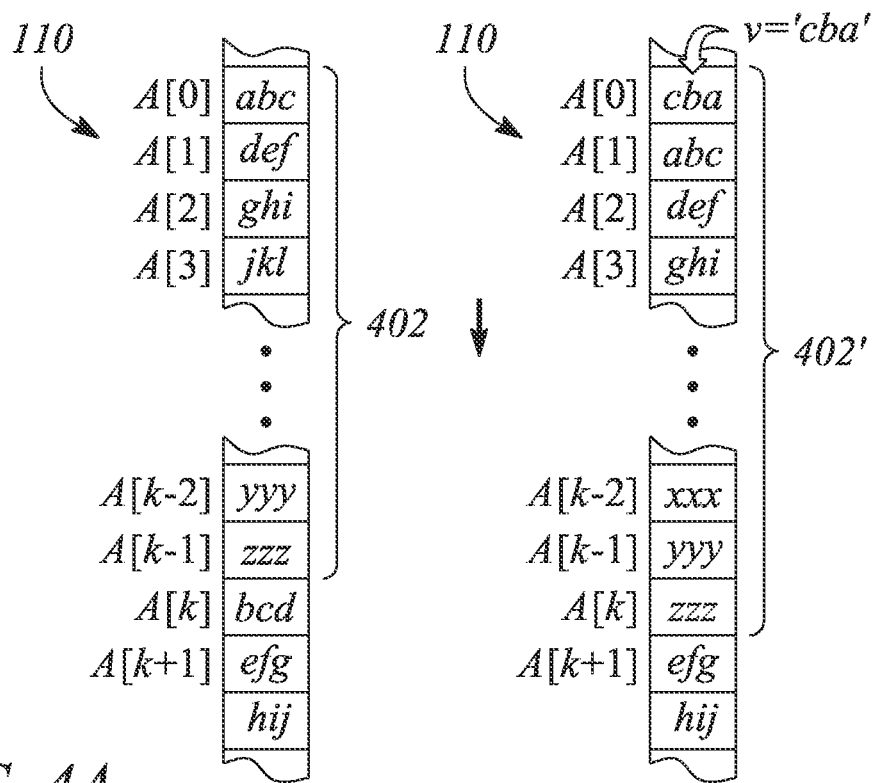
FIG. 4A illustrates an example of a shift-and-store primitive operating on a contiguous subset of data within a shiftable memory, according to an example in accordance with the principles described herein.

FIG. 4A illustrates a shift-and-store primitive operating on a contiguous subset of data within the shiftable memory 100, according to an example of the principles described herein. In particular, data (e.g., 'abc', 'def', 'ghi', ..., 'zzz') of the contiguous subset 402 stored in memory locations designated A[0], A[1], A[2], . . . A[k−1] (e.g., the first location) of the memory 110 are downshifted into memory locations A[1], . . . , A[k] (e.g., the second location), as illustrated by a heavy arrow in FIG. 4A. Then a value (e.g., 'cba') designated by the parameter v is inserted into the memory location designated A[0] to append the value to an updated contiguous subset 402', as illustrated on the right side of FIG. 4A.

In some examples, the atomic primitive 120 comprises a fetch-and-shift primitive. The fetch-and-shift primitive is configured to read data from a beginning of the contiguous subset. The fetch-and-shift primitive is further configured to upshift the contiguous subset in the memory using the built-in shifting capability. The fetch-and-shift primitive may be substantially similar in operation to a pop-from-stack operation with the contiguous subset as the stack (e.g., of depth k), albeit utilizing shiftable memory 100, according to some examples. In some examples, the fetch-and-shift primitive may be represented as a function fetch-and-shift (A, k) with the parameters A and k having the same meaning as described above with respect to the function for the shift-and-store primitive. Similarly, the parameter k may be replaced with the parameter K described above.

Figure 4B:
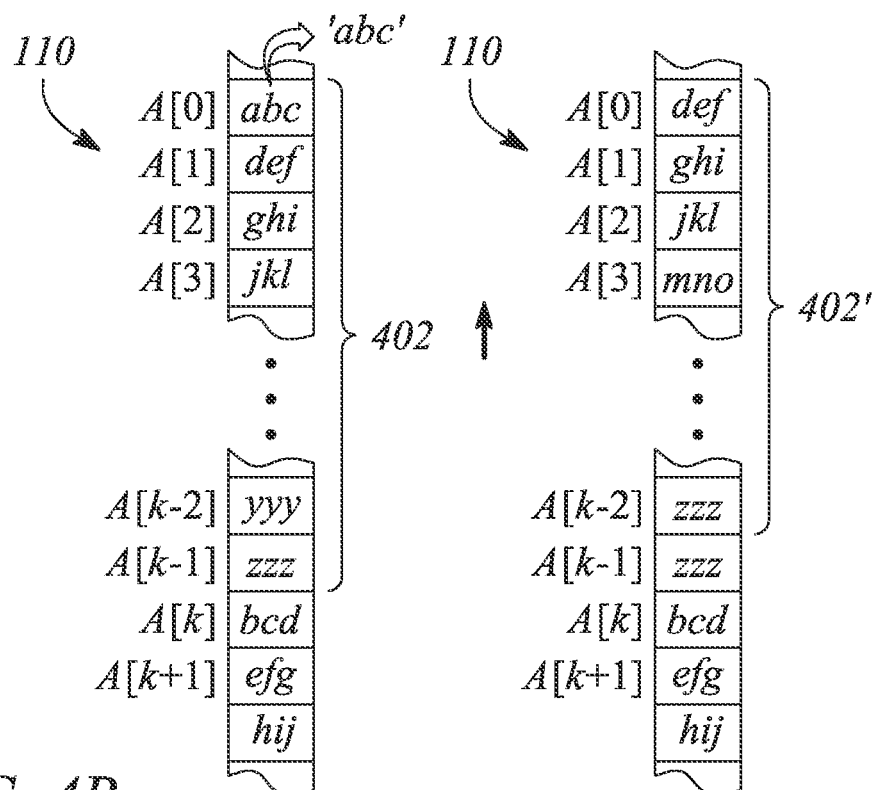
FIG. 4B illustrates an example of a fetch-and-shift primitive operating on a contiguous subset of data within a shiftable memory, according to an example in accordance with the principles described herein.

FIG. 4B illustrates an example of a fetch-and-shift primitive operating on a contiguous subset 402 of data within the shiftable memory 100, according to an example of the principles described herein. In particular, first a value (e.g., 'abc') at memory location A[0] at the beginning of the contiguous subset 402 is read (e.g., returned by the function), as illustrated on a left side of FIG. 4B. Then, as illustrated by a heavy arrow in FIG. 4B, the data (e.g., 'def', 'ghi', . . . 'zzz') of the contiguous subset 402 below the memory location A[0] stored in memory locations designated A[1], A[2], A[3], . . . , A[k−1] (e.g., the first location) of the memory 110 are upshifted into memory locations A[0], . . . A[k−2] (e.g., the second location) to yield the updated contiguous subset 402'. Further, as illustrated, the memory location A[k−1] retains the data (e.g., 'zzz') that was present before the upshift, by way of example. In other examples, the data in memory location A[k−1] may be rendered indeterminate (e.g., 'X') after the upshift. In yet other examples, the data in memory location A[k−1] may be erased (e.g., set to '0' or to a non-data value 'NIL') as a result of the upshift.

In some examples, the atomic primitive 120 comprises a shift-and-store-and-increment primitive. The shift-and-store-and-increment primitive is configured to downshift the contiguous subset in the memory using the built-in shifting capability. Further, the shift-and-store-and-increment primitive is configured to add or append data onto a beginning of the contiguous subset and to increment a value that identifies a bottom of a portion of the contiguous subset by an amount of the downshift.

According to various examples, the amount of the downshift may be one or more data units (e.g., a bit, a byte, a data word, etc.). For example, the shift-and-store-and-increment primitive may be configured to downshift the contiguous subset of data by a single data unit. In another example, the downshift may shift the data of the contiguous subset of data by two, three or more data units. In some examples, a size of the data appended onto the beginning of the contiguous subset is substantially equal to the amount of the downshift. For example, the size of the appended data may be one data word when the downshift is one data word. In another example, the downshift may move the contiguous subset of data by three data words and the size of the data appended onto the beginning of the contiguous subset similarly may be three data words.

According to various examples, the portion of the contiguous subset, the bottom of which is identified by the incremented value, may be any portion up to and including the entire contiguous subset. In some examples, the portion is a top portion of the contiguous subset extending from the beginning of the contiguous subset. For example, the contiguous subset portion may comprise memory locations of the contiguous subset that have had data stored therein. A remaining portion of the contiguous subset below the bottom contains no data or at least data that is not of interest in the context of the shift-and-store-and-increment primitive. The memory locations below the bottom may contain a special data word or value designated 'NIL' that may be recognized as 'no data,' for example.

The bottom of the contiguous subset portion described above may be substantially analogous to a bottom of a stack, for example. As data is appended or pushed onto a top of the stack, the stack fills with the data causing the stack to expand downward. The downward expansion of the stack, in turn, moves the bottom downward away from the top of the stack, for example. In some examples, the shift-and-store-and-increment primitive is substantially similar to the shift-and-store primitive described above with the added ability to track the bottom or equivalently a size of the contiguous subset portion within the contiguous subset.

In some examples, the shift-and-store-and-increment primitive may be represented as a function shift-and-store-and-increment (A, k, v, T), where the parameters A, k, and v having the same meaning as described above with respect to the function for the shift-and-store primitive. Further, a parameter T of the function shift-and-store-and-increment (A, k, v, T) may indicate the bottom of the contiguous subset portion (e.g., where the parameter k identifies the bottom of contiguous subset portion). For example, the parameter T may be a pointer to or an address of the bottom of the contiguous subset portion. In another example, the parameter T may be an address of a register that holds a pointer to or address of the bottom of the contiguous subset portion. In yet another example, the parameter T may be a size of the contiguous subset portion from which the address of the bottom may be computed. The parameter T is incremented by an amount of the downshift, according to various examples. In other examples, the parameter T may be omitted and the parameter k may be incremented, instead (e.g., where k identifies the bottom of the contiguous subset portion instead of the bottom of the contiguous subset).

Figure 4C:
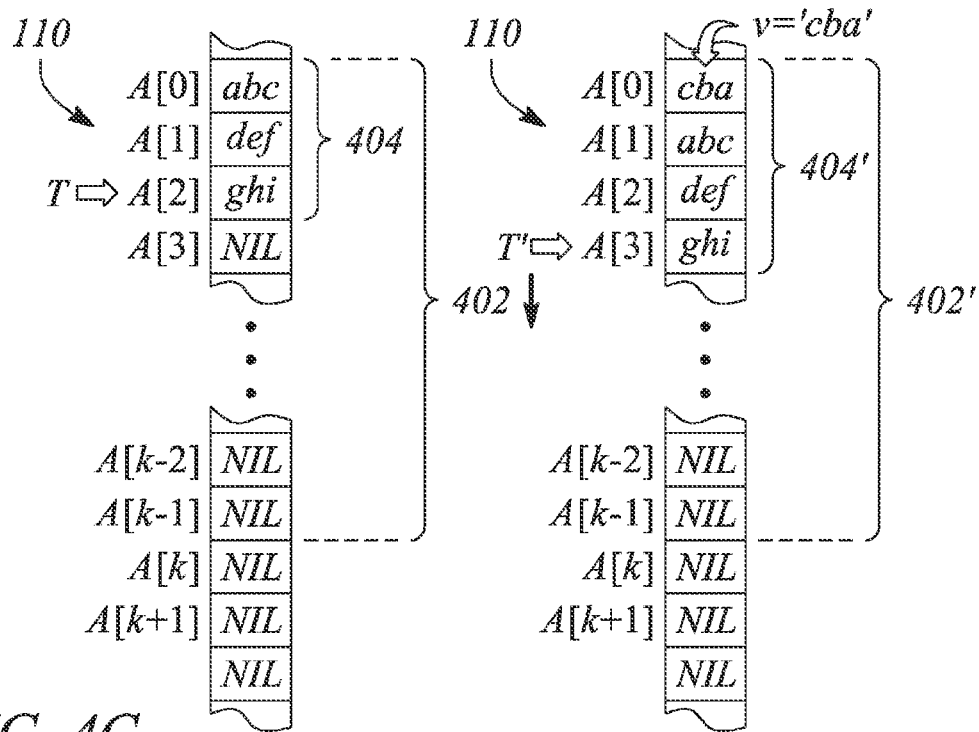
FIG. 4C illustrates an example of a shift-and-store-increment primitive operating on a contiguous subset of data within a shiftable memory, according to an example in accordance with the principles described herein.

FIG. 4C illustrates a shift-and-store-increment primitive operating on a contiguous subset 402 of data within the shiftable memory 100, according to an example of the principles described herein. In particular, a left side of FIG. 4C illustrates the contiguous subset 402 prior to application of the shift-and-store-and-increment primitive while a right side of FIG. 4C illustrates an updated contiguous subset 402' after the shill-and-store-and-increment primitive has been applied. For example, the left side of FIG. 4C illustrates data (e.g., 'abc', 'def', 'ghi') of the contiguous subset portion 404 previously stored in memory locations designated A[0], A[1] and A[2]. The pointer T indicates the bottom of the contiguous subset portion 404, as illustrated. Further as illustrated on the left side of FIG. 4C, memory locations (e.g., A[3], . . . , A[k−1] below the bottom contain non-data words 'NIL'. In other examples (not illustrated), data other than non-data words 'NIL' may be stored below the bottom. In particular, data that is stored below the bottom (e.g., below the end of a stack) may be arbitrary, according to some examples.

Referring to the right side of FIG. 4C, execution of the shift-and-store-and-increment primitive downshifts the contiguous subset 402 moving the data of the contiguous subset portion 404 (e.g., 'abc', 'def', 'ghi') from memory locations A[0], A[1] and A[2] (e.g., the first location) to memory locations A[1], A[2] and A[3] (e.g., the second location) of the memory 110, as illustrated by a heavy arrow. Then a value (e.g., 'cba') designated by the parameter v is inserted into the memory location designated A[0] to add or append the value to an updated contiguous subset portion 404', as illustrated. Further, the pointer T to the bottom of the contiguous subset portion is incremented to become an updated pointer T that points to the new bottom of the updated contiguous subset portion 404' at memory location A[3], as illustrated. For example, as illustrated in FIG. 4C, the updated pointer T' is incremented by an amount that is equivalent to an amount of the downshift (e.g., a data word).

In some examples, the atomic primitive 120 comprises a fetch-and-shift-and-decrement primitive. The fetch-and-shift-and-decrement primitive is configured to read or fetch data from the beginning of the contiguous subset. The fetch-and-shift-and-decrement primitive is further configured to upshift the contiguous subset in the memory using the built-in shifting capability and to decrement a value that identifies the bottom of the contiguous subset portion by an amount of the upshift. As with the downshift amount described above with respect to the shift-and-store-and-increment primitive, the amount of upshift may be one or more data units (e.g., one or more data words). In some examples, a size in terms of data units of the data that is read or fetched from the beginning of the contiguous subset is substantially equal to the amount of the upshift.

As with the shift-and-store-and-increment primitive, when considering the fetch-and-shift-and-decrement primitive the bottom of the contiguous subset portion may be substantially analogous to the bottom of a stack, for example. As data is fetched or popped off of the top of the stack, the stack empties causing the stack to shrink or deflate. The deflation of the stack, in turn, moves the bottom upward toward the top of the stack, for example. In some examples, the fetch-and-shift-and-decrement primitive is substantially similar to the fetch-and-shift primitive described above with the added ability to track the bottom or equivalently a size of the contiguous subset portion within the contiguous subset. In some examples, the fetch-and-shift-and-decrement primitive may be represented as a function fetch-and-shift-and-decrement (A, k, T), where the parameters A, k and T having the same meaning as described above. The parameter T is decremented by an amount of the upshift, according to various examples. In other examples, the parameter T may be omitted and the parameter k may be decremented, instead.

Figure 4D:
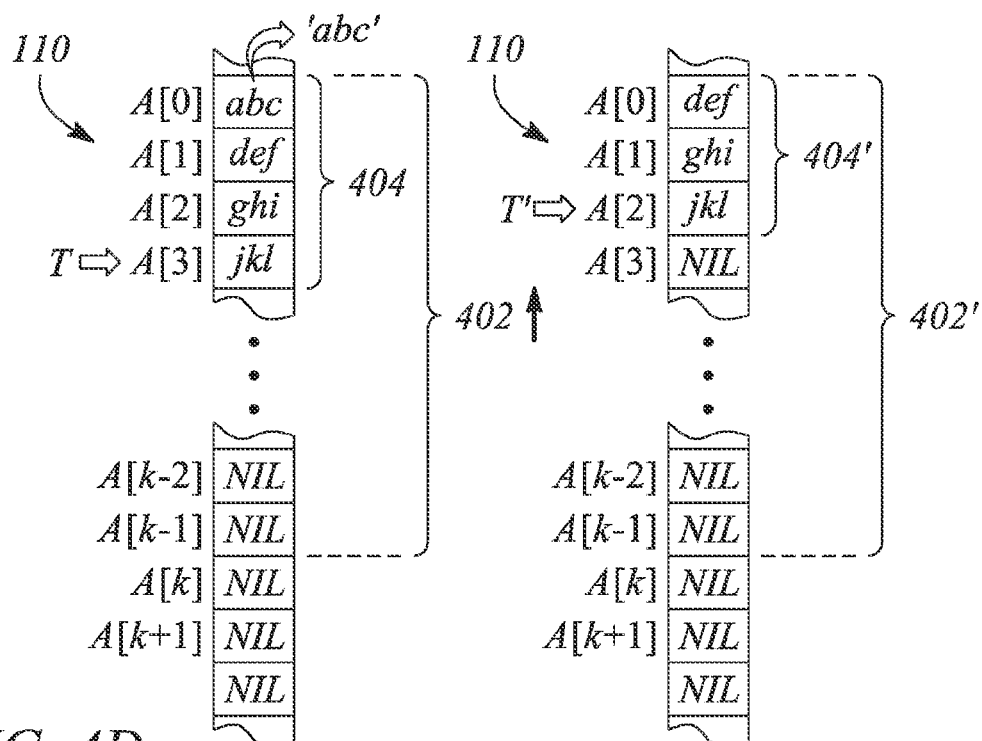
FIG. 4D illustrates an example of a fetch-and-shift-and-decrement primitive operating on a continuous subset of data within a shiftable memory, according to an example in accordance with the principles described herein.

FIG. 4D illustrates a fetch-and-shift-and-decrement primitive operating on a contiguous subset 402 of data within the shiftable memory 100, according to an example of the principles described herein. In particular, a left side of FIG. 4D illustrates the contiguous subset 402 prior to application of the fetch-and-shift-and-decrement primitive while a right side of FIG. 4D illustrates an updated contiguous subset 402' after the fetch-and-shift-and-decrement primitive has been applied. For example, the left side of FIG. 4D illustrates data (e.g., 'abc','def', 'ghi', 'jkl') of the contiguous subset portion 404 previously stored in memory locations designated A[0], A[1], A[2] and A[3], respectively. The pointer T indicates the bottom of the contiguous subset portion 404, as illustrated. Further as illustrated on the left side of FIG. 4D, memory locations (e.g., A[4], . . . , A[k−1]) below the bottom contain non-data words 'NIL', for example. In other examples (not illustrated), data other than non-data words 'NIL' may be stored below the bottom. In particular, data that is stored below the bottom (e.g., below the end of a stack) may be arbitrary, according to some examples.

Referring to the right side of FIG. 4D, execution of the fetch-and-shift-and-decrement primitive reads or fetches data stored at the top of the contiguous subset (e.g., a first data word abc) and then upshifts the contiguous subset 402 moving remaining data of the contiguous subsea portion 404 (e.g., 'def', 'ghi', 'jkl') from memory locations A[1], A[2] and A[3] (e.g., the first location) to memory locations A[0], A[1] and A[2] (e.g., the second location) of the memory 110, as illustrated by a heavy arrow. The fetched data (e.g., 'abc') may be output by the fetch-and-shift-and-decrement primitive. Further, the pointer T to the bottom of the contiguous subset portion is decremented to be an updated pointer T' that points to the new bottom of an updated contiguous subset portion 404' at memory location A[2], as illustrated. For example, as illustrated in FIG. 4D, the updated pointer T' is decremented by an amount that is equivalent to the upshift (e.g., a data word).

In some examples, the atomic primitive 120 comprises a store-at-end primitive. The store-at-end primitive is configured to add or append data onto an end (i.e., the bottom) of the contiguous subset portion. In some examples, the store-at-end primitive may be represented as a function store-at-end (A, v, T), where the parameters A, v, and T having the same meaning as described above. According to some examples, the store-at-end primitive finds the bottom of the contiguous subset portion (e.g., using the parameter T) and then appends the value designated by v onto the bottom. In some examples, the pointer or address represented by the parameter T is incremented to point to the memory cell that is the new bottom. In other examples, the store-at-end primitive is configured to omit incrementing the parameter T.

Figure 4E:
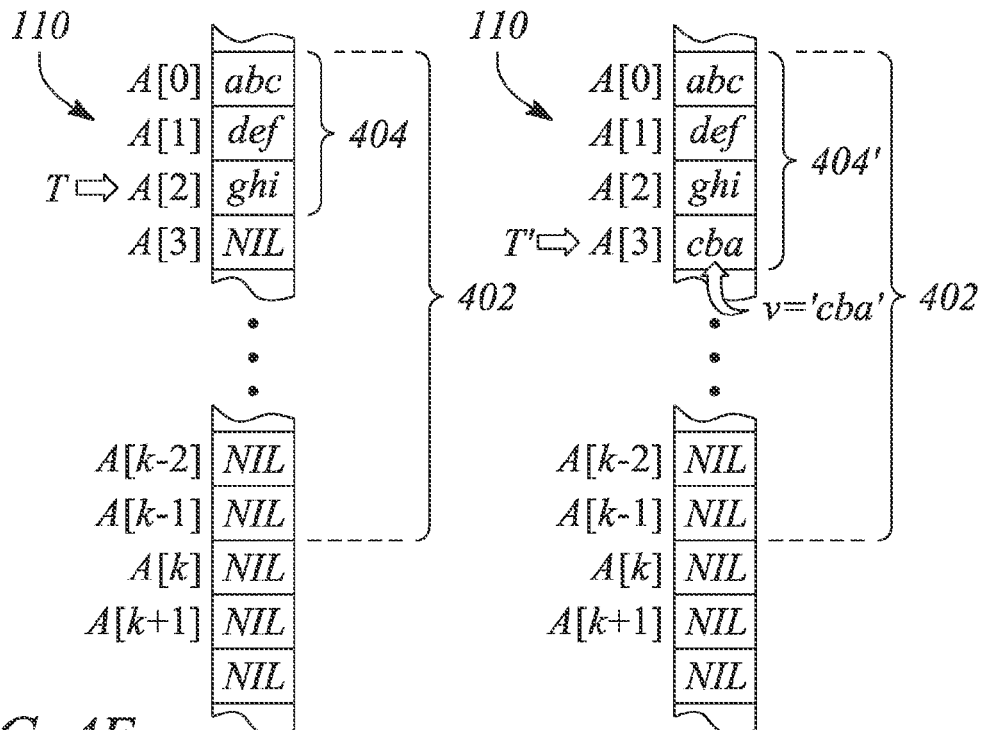
FIG. 4E illustrates an example of a store-at-end primitive operating on a contiguous subset of data within a shiftable memory, according to an example in accordance with the principles described herein.

FIG. 4E illustrates a store-at-end primitive operating on a contiguous subset 402 of data within the shiftable memory 100, according to an example in accordance with the principles described herein. A left side of FIG. 4E illustrates the contiguous subset 402 and the contiguous subset portion 404 in the memory 110 prior to application of the store-at-end primitive. A right side of FIG. 4E illustrates the contiguous subset 402 and an updated contiguous subset portion 404' after the store-at-end primitive has appended a value v (e.g., v='cba') to the bottom of the contiguous subset portion 404. Also illustrated is a result of incrementing the pointer represented by T to be an updated pointer T' that points to the new bottom of the updated contiguous subset portion 404'.

In some examples, the atomic primitive 120 comprises a remove-from-end primitive. The remove-from-end primitive is configured to remove data from an end (i.e., the bottom) of the contiguous subset portion. In some examples, the remove-from-end primitive may be represented as a function remove-from-end (A, T), where the parameters A, and T having the same meaning as described above. According to some examples, the remove-from-end primitive finds the bottom of the contiguous subset portion (e.g., using the parameter T) and then fetches the value stored in a memory cell at the bottom. In some examples, the pointer or address represented by the parameter T is decremented to point to the memory cell that is the new bottom. In other examples, the store-at-end primitive is configured to omit decrementing the parameter T.

Figure 4F:
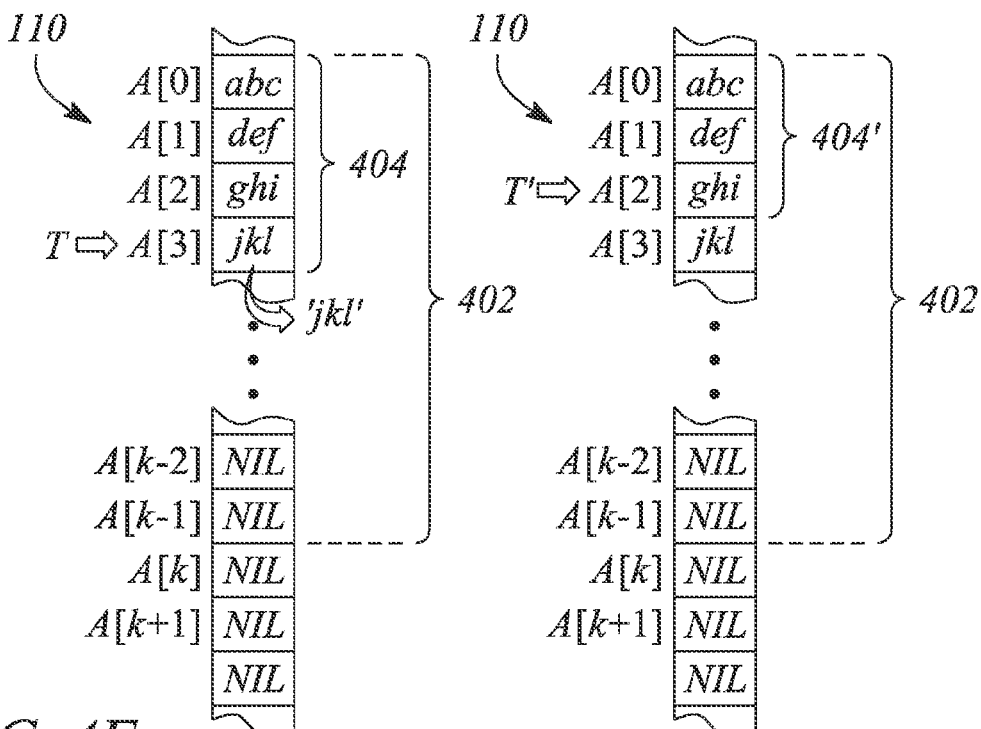
FIG. 4F illustrates an example of a remove-from-end primitive operating on a contiguous subset of data within a shiftable memory, according to an example in accordance with the principles described herein.

FIG. 4F illustrates a remove-from-end primitive operating on a contiguous subset 402 of data within the shiftable memory 100, according to an example of the principles described herein. A left side of FIG. 4F illustrates the contiguous subset 402 and the contiguous subset portion 404 prior to application of the remove-from-end primitive. A right side of FIG. 4F illustrates the contiguous subset 402 and an updated contiguous subset portion 404' after the remove-from-end primitive has removed a value stored at the bottom of the contiguous subset portion 404 (e.g., at A[3]='jkl'). Also illustrated is the pointer represented by T having been decremented to be an updated pointer T' that points to the new bottom of the updated contiguous subset portion 404'.

The removed value may be returned or output by the remove-from-end primitive, according to some examples. In some examples, the value (e.g., 'jkl') that was originally stored at the bottom of the contiguous subset portion 404 may remain, albeit outside of the continuous subset portion 404, following execution of the remove-from-end primitive, as illustrated. In other examples (not illustrated), the value that was originally stored at the bottom may be erased, overwritten or reset to or with a non-data value (e.g., NIL).

In some examples (not illustrated), the shiftable memory 100 further comprises a register to identify a beginning of the contiguous subset in the memory 110. For example, the register may be a memory cell that holds a pointer to or an address of the top of the contiguous subset of data in the memory 110. The register may be implemented as dedicated memory cell in the shiftable memory 100, but outside of the memory 110, for example. In another example, the register may be located elsewhere in memory. In some examples, the shiftable memory 100 is employed by multiple processes or threads of a multithreaded system. The register may be configured to be accessible to some or all of the threads that may share the shiftable memory 100, for example.

In some examples (not illustrated), the shiftable memory 100 further comprises another register to identify an end of a portion of the contiguous subset, wherein the portion of the contiguous subset is between the beginning and the end in the memory 110. For example, the other register may be another memory cell that holds a pointer to or an address (e.g., T) of the bottom of the contiguous subset portion in the memory 110. The other register may be substantially similar to the register described above. Specifically, the other register may be implemented as a dedicated memory cell in the shiftable memory 100, but outside of the memory 110, for example. In another example, the other register may be located elsewhere in memory. As mentioned above, the shiftable memory 100 may be employed by multiple processes or threads of a multithreaded system in some examples. The other register may be configured to be accessible to some or all of the threads that may share the shiftable memory 100, for example.

Figure 5:
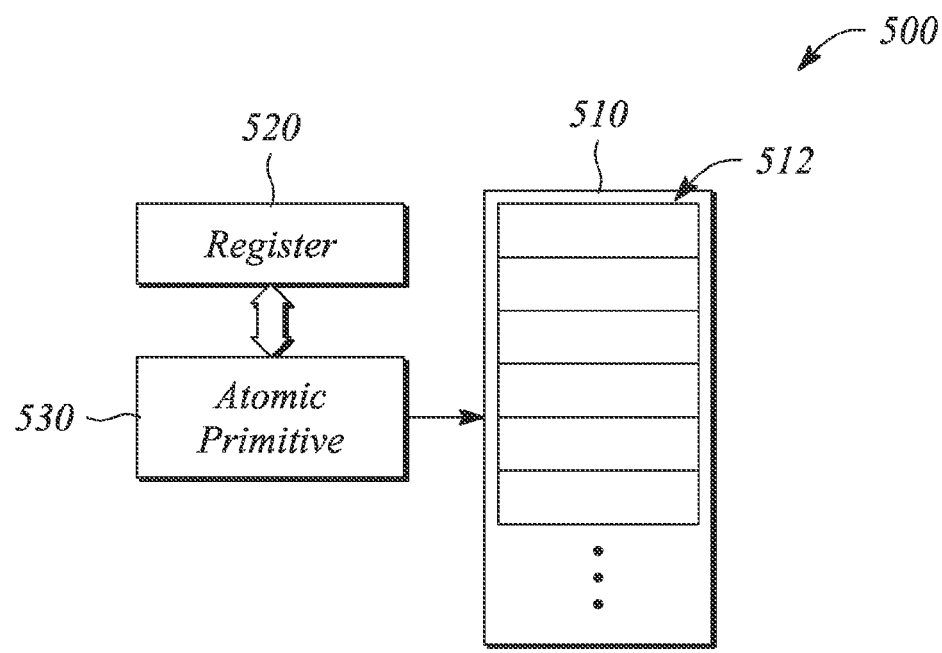
FIG. 5 illustrates a block diagram of a shiftable memory system supporting atomic operation, according to an example of the principles described herein.

FIG. 5 illustrates a block diagram of a shiftable memory system 500 supporting atomic operation, according to an example of the principles described herein. The shiftable memory system 500 supporting atomic operation comprises a shiftable memory 510. According to some examples, the shiftable memory 510 comprises a plurality of memory cells 512 with built-in data shifting capability. The built-in data shifting is configured to shift a contiguous subset of data stored in the memory cells 512 from a first location to a second location within the shiftable memory 510. The contiguous subset of data has a size (e.g., a length) that is smaller than a total size of the shiftable memory 510. In some examples, the shiftable memory 510 is substantially similar to the memory 110 described above with respect to the shiftable memory 100.

The shiftable memory system 500 supporting atomic operation further comprises a register 520. The register 520 is configured to identify an array defined on the memory cells 512 of the shiftable memory 510. The array, in turn, is configured to contain a portion of the contiguous subset of data being shifted by the shiftable memory 510, according to various examples. In some example, the array and the contiguous subset portion that it contains are substantially similar to the contiguous subset portion described above with respect to the shiftable memory 100. In particular, the register 520 may contain a pointer to or address of a beginning of the array, according to some examples. The pointer pointing to a memory location of the beginning of the array identifies the array. As such, the register 520 identifies the beginning of the array, according to some examples.

The shiftable memory system 500 supporting atomic operation further comprises an atomic primitive 530. The atomic primitive 530 is defined on the shiftable memory 510 and is configured to operate on the contiguous subset portion in the array identified by the register 520. In some examples, the atomic primitive 530 is substantially similar to the atomic primitive 120 described above with respect to the shiftable memory 100.

In particular, in some examples, the atomic primitive 530 comprises a shift-and-store atomic primitive. In some examples, the shift-and-store atomic primitive is substantially similar to the shift-and-store primitive described above with respect to the shiftable memory 100. Specifically, the shift-and-store atomic primitive is configured to downshift the contiguous subset using the built-in shifting capability of the shiftable memory 510, for example. The shift-and-store atomic primitive is further configured to insert data onto a beginning of the array. Inserting data at the beginning of the array adds or appends the inserted data to the contiguous subset, according to various examples.

In some examples, the atomic primitive 530 comprises a fetch-and-shift atomic primitive. In some examples, the fetch-and-shift atomic primitive is substantially similar to the fetch-and-shift primitive described above with respect to the shiftable memory 100. Specifically, the fetch-and-shift atomic primitive is configured to fetch, return or read data from the beginning of the array. The fetch-and-shill atomic primitive is further configured to upshift a remaining portion of the contiguous subset using the built-in shifting capability of the shiftable memory. The remaining portion is defined as all of the contiguous subset except for the data that is read, in some examples. In other examples, the remaining portion includes the data that is read. The upshift removes the read data from the contiguous subset, according to various examples. For example, the upshift may overwrite the data that was read with data from the remaining portion. In another example, the upshift moves the data that was read outside of the array (e.g., above the memory cell pointed to by a pointer of the register 520).

In some examples, the atomic primitive 530 comprises a shift-and-store-and-increment atomic primitive. In some examples, the shift-and-store-and-increment atomic primitive is substantially similar to the shift-and-store-and-increment primitive described above with respect to the shiftable memory 100. Specifically, the shift-and-store-and-increment atomic primitive is configured to downshift the contiguous subset using the built-in shifting capability. The shift-and-store-and-increment atomic primitive is further configured to insert data onto a beginning of the array and to increment a value to identify an end of the array by an amount of the downshift. The value may be a pointer to a bottom of the array, for example.

In some examples, the atomic primitive 530 comprises a fetch-and-shift-and-decrement atomic primitive. In some examples, the fetch-and-shift-and-decrement atomic primitive is substantially similar to the fetch-and-shift-and-decrement primitive described above with respect to the shiftable memory 100. Specifically, the fetch-and-shift-and-decrement atomic primitive is configured to read data from the beginning of the array. The fetch-and-shift-and-decrement atomic primitive is further configured to upshift the contiguous subset using the built-in shifting capability and to decrement a value to identify an end of the array by an amount of the upshift. The value may be a pointer to a bottom of the array, for example.

In some examples, the atomic primitive 530 comprises a store-at-end atomic primitive. In some examples, the store-at-end atomic primitive is substantially similar to the store-at-end primitive described above with respect to the shiftable memory 100. Specifically, the store-at-end atomic primitive is configured to insert data onto an end of the contiguous subset portion in the array using a value to identify an end of the array (opposite the beginning of the array) and to increment the value. The value may be a pointer to a bottom of the array, for example.

In some examples, the atomic primitive 530 comprises a remove-from-end atomic primitive. In some examples, the remove-from-end atomic primitive is substantially similar to the remove-from-end primitive described above with respect to the shiftable memory 100. Specifically, the remove-from-end atomic primitive is configured to read data from an end of a contiguous subset portion in the array and decrement a value that identifies the end of the array opposite the beginning of the array. The value may be a pointer to a bottom of the array, for example.

Figure 6:
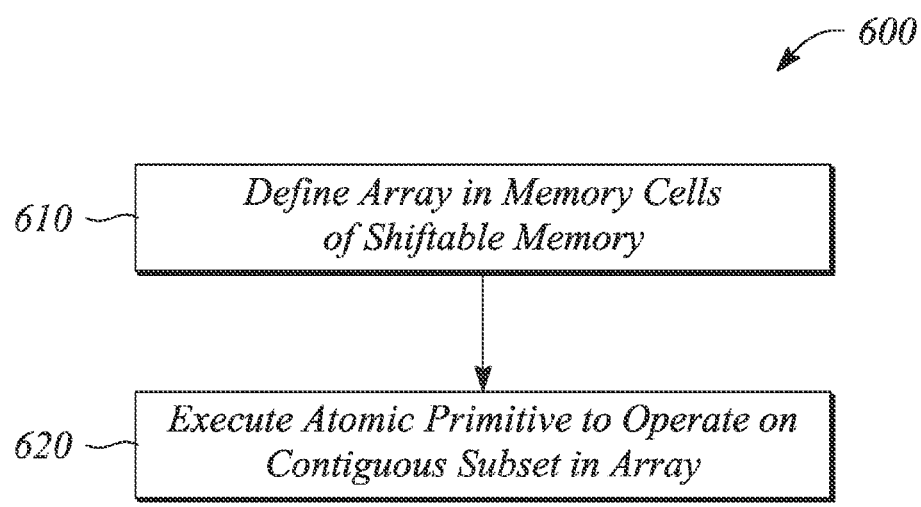
FIG. 6 illustrates a flow chart of a method of atomic operation using shiftable memory, according to an example of the principles described herein.

FIG. 6 illustrates a flow chart of a method 600 of atomic operation using shiftable memory, according to an example of the principles described herein. As illustrated, the method 600 of atomic operation using shiftable memory comprises defining 610 an array in memory cells of the shiftable memory. The shiftable memory has a plurality of memory cells with a built-in shifting capability to shift a contiguous subset of data stored in the array from a first location to a second location. In some examples, the shiftable memory is substantially similar to the memory 110 having built-in shifting capability described above with respect to the shiftable memory 100. In particular, a size of the contiguous subset of data of the shiftable memory is less than a total size of the shiftable memory and the built-in shifting capability comprises one or both of an upshift and a downshift, according to various examples.

The method 600 of atomic operation using shiftable memory further comprises executing 620 an atomic primitive. When executed 620, the atomic primitive operates on the contiguous subset of data stored in the array. By 'operates on', it is meant that the atomic primitive performs an operation on the data (e.g., storing, fetching, shifting, etc.) including the data in contiguous subset. Further, when the contiguous subset in the array is shifted during execution 620 of the atomic primitive, the shifting occurs entirely within the shiftable memory and shifts only data of the contiguous subset.

In some examples, executing 620 the atomic primitive to operate on the contiguous subset in the array comprises one or more of performing atomically a shift-and-store primitive, performing atomically a fetch-and-shift primitive, performing atomically a shift-and-store-and-increment primitive, performing atomically a fetch-and-shift-and-decrement primitive, performing atomically store-at-end primitive, and performing atomically remove-from-end primitive. In some examples, the atomic operation is performed in the context of a concurrent, multithreaded system.

In some examples, performing atomically a shift-and-store primitive comprises downshifting the contiguous subset in the array away from a top of the array using the built-in shifting capability, inserting data at the top of the array, and incrementing a value identifying a bottom of the array. In some examples, performing atomically a fetch-and-shift primitive comprises reading data at a top of the array and upshifting the contiguous subset in the array toward the top of the array using the built-in shifting capability. In some examples, performing atomically a shift-and-store-and-increment primitive comprises downshifting the contiguous subset in the array away from a top of the array using the built-in shifting capability, inserting data at the top of the array, and incrementing a value identifying a bottom of the array. In some examples, performing atomically a fetch-and-shift-and-decrement primitive comprises reading data at a top of the array, upshifting the contiguous subset in the array toward the top of the array using the built-in shifting capability, and decrementing a value identifying a bottom of the array. In some examples, performing atomically store-at-end primitive comprises appending data onto a bottom of the contiguous subset in the array and incrementing a value identifying a bottom of the array. In some examples, performing atomically remove-from-end primitive comprises decrementing a value identifying a bottom of the array and reading data at the bottom of the array.

Thus, there have been described examples of a shiftable memory and a shiftable memory system each supporting atomic operation and a method of atomic operation using shiftable memory. It should be understood that the above-described examples are merely illustrative of some of the many specific examples that represent the principles described herein. Clearly, those skilled in the art can readily devise numerous other arrangements without departing from the scope as defined by the following claims.

What is claimed is:

1. A shiftable memory supporting atomic operation, comprising:
   a memory to store data, the memory having built-in shifting capability to shift a contiguous subset of the data from a first location to a second location within the memory, the contiguous subset of data having a size that is smaller than a total size of the memory, wherein the built-in shifting capability is to shift the contiguous subset in the memory without using a processor external of the shiftable memory to perform the shift; and
   an atomic primitive implemented using a processing circuit in the memory to perform the atomic operation on the contiguous subset,
   wherein the memory having the built-in shifting capability is to shift only data of the contiguous subset when the contiguous subset is shifted, wherein the memory comprises a controller to:
   receive address information from the processor external of the shiftable memory, and
   determine a length of the contiguous subset based on the received address information.

2. The shiftable memory of claim 1, wherein the atomic primitive comprises a shift-and-store primitive, the shift-and-store primitive to downshift the contiguous subset in the memory using the built-in shifting capability and to append data onto a beginning of the contiguous subset.

3. The shiftable memory of claim 1, wherein the atomic primitive comprises a fetch-and-shift primitive, the fetch-and-shift primitive to read data from a beginning of the contiguous subset and to upshift the contiguous subset in the memory using the built-in shifting capability.

4. The shiftable memory of claim 1, wherein the atomic primitive comprises a shift-and-store-and-increment primitive, the shift-and-store-and-increment primitive to downshift the contiguous subset in the memory using the built-in shifting capability, to append data onto a beginning of the contiguous subset, and to increment a value that identifies a bottom of a portion of the contiguous subset by an amount of the downshift.

5. The shiftable memory of claim 1, wherein the atomic primitive comprises a fetch-and-shift-and-decrement primitive, the fetch-and-shift-and-decrement primitive to read data from the beginning of the contiguous subset, to upshift the contiguous subset in the memory using the built-in shifting capability, and to decrement a value that identifies a bottom of a portion of the contiguous subset by an amount of the upshift.

6. The shiftable memory of claim 1, wherein the atomic primitive comprises one of a store-at-end primitive and a remove-from-end primitive, the store-at-end primitive to append data onto an end of a portion of the contiguous subset opposite a beginning of the contiguous subset, and the remove-from-end primitive to remove data from the end of the portion of the contiguous subset.

7. The shiftable memory of claim 1, the shiftable memory further comprising one or both of a register to identify a beginning of the contiguous subset in the memory and another register to identify an end of a portion of the contiguous subset, wherein the portion of the contiguous subset is between the beginning of the contiguous subset and an end of the contiguous subset.

8. A concurrent, multithreaded system that includes the shiftable memory of claim 1, the atomic primitive facilitating sharing of the shiftable memory by multiple threads of the multi-threaded system.

9. A shiftable memory comprising:
   a memory comprising a plurality of memory cells and a built-in data shifting capability to shift a contiguous subset of data stored in the memory cells from a first location to a second location within the memory, the contiguous subset of data having a size that is smaller than a total size of the memory, the memory further comprising a controller to:
   receive address information from a processor external of the shiftable memory, and
   determine a length of the contiguous subset based on the received address information;
   a register to identify an array defined on the memory cells, the array to contain a portion of the contiguous subset of data being shifted; and
   an atomic primitive defined on the shiftable memory to operate on the portion of the contiguous subset in the array identified by the register.

10. The shiftable memory of claim 9, wherein the atomic primitive comprises one or more of:
    a shift-and-store atomic primitive to downshift the contiguous subset using the built-in shifting capability of the shiftable memory and to insert data onto a beginning of the array, where the inserted data is appended to the contiguous subset; and
    a fetch-and-shift atomic primitive to read data from the beginning of the array and to upshift a remaining portion of the contiguous subset using the built-in shifting capability of the shiftable memory, where the read data is removed from the contiguous subset,
    wherein the beginning of the array is identified by the register.

11. The shiftable memory of claim 9, wherein the atomic primitive comprises one or more of:
    a shift-and-store-and-increment atomic primitive to downshift the contiguous subset using the built-in shifting capability, to insert data onto a beginning of the array, and to increment a value to identify an end of the array opposite the beginning by an amount of the downshift;
    a fetch-and-shift-and-decrement atomic primitive to read data from the beginning of the array, to upshift the contiguous subset using the built-in shifting capability, and to decrement a value to identify an end of the array opposite the beginning by an amount of the upshift;
    a store-at-end atomic primitive to insert data onto an end of the contiguous subset portion in the array using a value to identify an end of the array opposite the beginning of the array and to increment the value; and
    a remove-from-end atomic primitive to read data from an end of the contiguous subset portion in the array and to decrement a value that identifies the end of the array opposite the beginning of the array,
    wherein the beginning of the array is identified by the register.

12. A method of atomic operation using-a memory, the method comprising:
    defining an array in memory cells of the memory, the memory having a plurality of memory cells with built-in shifting capability to shift a contiguous subset of data stored in the array from a first location to a second location, a size of the contiguous subset of data being less than a total size of the shiftable memory, the built-in shifting comprising one or both of an upshift and a downshift, wherein the built-in shifting capability shifts the contiguous subset in the memory without using a processor external of the shiftable memory to perform the shift; and executing an atomic primitive comprising a processing circuit of the memory, the atomic primitive performing the atomic operation on the contiguous subset in the array, wherein when the contiguous subset in the array is shifted, the shifting occurs entirely within the memory and only data of the contiguous subset is shifted, wherein the memory comprises a controller, the method further comprising:

receiving, by the controller in the memory, address information from the processor external of the shiftable memory, and determining, by the controller, a length of the contiguous subset based on the received address information.

13. The method of claim 12, wherein executing the atomic primitive comprises one of:

performing atomically a shift-and-store primitive comprising:

downshifting the contiguous subset in the array away from a top of the array and inserting data at the top of the array using the built-in shifting capability; and performing atomically a fetch-and-shift primitive comprising:

reading data at a top of the array and upshifting the contiguous subset in the array toward the top of the array using the built-in shifting capability.

14. The method of claim 12, wherein executing the atomic primitive comprises one of:

performing atomically a shift-and-store-and-increment primitive comprising:

downshifting the contiguous subset in the array away from a top of the array using the built-in shifting capability, inserting data at the top of the array, and incrementing a value identifying a bottom of the array;

performing atomically a fetch-and-shift-and-decrement primitive comprising:

reading data at a top of the array, upshifting the contiguous subset in the array toward the top of the array using the built-in shifting capability, and decrementing a value identifying a bottom of the array;

performing atomically store-at-end primitive comprising:

appending data onto a bottom of the contiguous subset in the array and incrementing a value identifying a bottom of the array; and performing atomically remove-from-end primitive comprising:

decrementing a value identifying a bottom of the array and reading data at the bottom of the array.

15. The method of claim 12, wherein the atomic operation is performed in a context of a concurrent, multi-threaded system.

16. The shiftable memory of claim 9, wherein the atomic primitive is implemented with a processing circuit in the memory, and the atomic primitive is to perform an atomic operation on the portion of the contiguous subset in the array identified by the register.

* * * * *